United States Patent [19]

Lawandy

[11] Patent Number: 5,670,280
[45] Date of Patent: Sep. 23, 1997

[54] OPTICALLY CONTROLLED IMAGING PHASE MASK ELEMENT

[75] Inventor: Nabil M. Lawandy, Providence, R.I.

[73] Assignee: Brown University Research Foundation, Providence, R.I.

[21] Appl. No.: 656,886

[22] Filed: May 30, 1996

[51] Int. Cl.$^6$ .................................................. G03F 9/00
[52] U.S. Cl. ................................................ 430/5; 430/322
[58] Field of Search ........................ 430/5, 322; 385/124

[56] References Cited

U.S. PATENT DOCUMENTS

| | | | |
|---|---|---|---|
| 5,287,427 | 2/1994 | Atkins et al. | 385/124 |
| 5,291,012 | 3/1994 | Shimizu et al. | 250/216 |
| 5,457,760 | 10/1995 | Mizrahi | 385/37 |
| 5,472,811 | 12/1995 | Vasudev et al. | 430/5 |
| 5,478,371 | 12/1995 | Lemaire et al. | 65/384 |
| 5,499,076 | 3/1996 | Muraki | 355/53 |
| 5,500,031 | 3/1996 | Atkins et al. | 65/386 |
| 5,501,925 | 3/1996 | Smith et al. | 430/5 |

OTHER PUBLICATIONS

"Overview of transverse effects in nonlinear–optical systems" by N.B. Abraham & W.J. Firth, J. Opt. Soc. Am. B, vol. 7 No. 6, Jun. 1990 pp. 951–962.

"Waveguides and fibers for nonlinear optics" by G.I. Stegeman & R.H. Stolen, J. Opt. Soc. Am.B. Bol. 6 N1. 4/ Apr. 1989, pp. 652–662.

"Adaptive array illumination and structured light generated by spatial zero–order self–phase modulation in a Kerr medium" by J. Gluckstad, Optics Comm., 1203 (1995) pp. 194–203.

"Long–Transient Effects in Lasers with Inserted Liquid Samples" by J.P. Gordon, R. C. C. Leite, R. S. Moore, S.P.S. Porto and J.R. Whinnery, J. Appl. Phys. 36 No. 1, Jan. 1965 pp. 3–8.

"Implementation Of a Hybrid Lens" F.A.P. Tooley, S.M. Prince, M.R. Taghizadeh, etc. J. Opt. Soc. Am. B vol. 34, No. 28/Oct. 1995, pp. 675–684.

"Coplanar refractive–diffractive doublets for optoelectronic integrates systems" by Zhiping Zhou and T.J. Drabik, Applied Optics/ vol. 34, No. 17 Jun. 1995 pp. 3048–2054.

"Binary surface–relief gratings for array illumination in digital optics" by A. Vasara, M.R. Taghizadeh, J. Turnen, J. Westerholm, Eero Noponen, etc. Applied Optics, vol. 31, No. 17/ Jun. 1992, pp. 3320–3336.

"Optical parallel–access shared memory system: analysis and experimental demonstration" by Kuang–Yu J. Li and B. Keith Jenkins, Applied Optics/vol. 34, No. 2, Jan. 1995 pp. 358–369.

"Optical nonlinearities in $CdS_xSe_{1-x}$–doped glass waveguides" Finlayson et al., J. Opt. Soc. Am. B. vol. 6, No. 4?Apr. 1989, pp. 675–684.

"Measurement of nondegenerate nonlinearities using a two–color Z scan" by M. Sheik–Bahae, J. Wang, R. DeSalve, D.J. Hagan and E.W. Van Stryland, Optics Letters, vol. 17, No. 4/Feb. 1992 pp. 258–260.

"Effects of multiple internal sample reflections on nonlinear refractive Z–scan mearurements", by Richard L. Sutherland, Applied Optics vol. 33, No. 24/Aug. 1994 pp. 5576–5584.

"Imaging properties of Gaussian beams with a nonlinear graded–index rod lens", Z. Chen and H. Lai, J. Opt. Soc. Am. B/vol. 9, No. 12/Dec. 1992.

*Primary Examiner*—S. Rosasco
*Attorney, Agent, or Firm*—Perman & Green, LLP

[57] ABSTRACT

An optical element includes a phase mask made of a nonlinear material. The element uses the nonlinearity to produce an intensity dependent lens which controls the imaging properties. The invention enables the optical control of the image of an array produced by a diffractive spot generator in direct contact with a thin semiconductor doped glass substrate. By example, the focus of an image at 632.8 nm from a He–Ne laser is controlled by 514.5 nm light from an Argon Ion laser.

20 Claims, 4 Drawing Sheets

OPTICALLY CONTROLLED IMAGING PHASE MASK ELEMENT

STATEMENT OF GOVERNMENT INTEREST

This invention was made with Government support under Grant/Contract No. F49620-94-1-0013 awarded by the Air Force Office of Scientific Research. The Government has certain rights in this invention.

FIELD OF THE INVENTION

This invention relates generally to optical systems and methods and, in particular, to phase shift masks and methods for using same.

BACKGROUND OF THE INVENTION

Light propagation through optical nonlinear media has been a subject of interest for a number of years. An optical nonlinearity is known to produce an intensity dependent index of refraction which can in turn lead to self-phase modulation and cross-phase modulation effects. These effects have been used for a number of applications in nonlinear guided wave optics, optical control of light, and imaging. Recently, J. Glückstad reported the use of self-phase modulation to make an adaptive array illuminator (J. Glückstad, Optics Comm. 120, 194–203(1995)), and Z. Chen and H. Lai reported a theory of imaging where a gradient refractive index lens was used in conjunction with an optical nonlinearity to focus Gaussian beams (Z. Chen, H. Lai, J. Opt. Soc. Am. B 9, 2248–2251 (1992).

A phase shift mask (PSM) is known in the art, as evidenced by U.S. Pat. No. 5,472,811 to Vasudev et al. As described, the conventional PSM creates phase shifting regions in a transparent area of a photomask. The phase shifting regions can be formed either by depositing transparent films of appropriate thickness, and then patterning and etching the films, or by etching vertical trenches into a surface of a silica (quartz) substrate. The resulting surface features are designed to produce a desired 180° phase shift at a predetermined wavelength of incident light. One important application for such a phase shift mask is in the photolithography of semiconductor wafers, particularly when it is desired to define features that have dimensions that are smaller than the wavelengths of conventional light sources.

OBJECTS OF THE INVENTION

It is a first object of this invention to provide an improved phase shift mask.

It is a further object of this invention to provide a phase shift mask having a focal length or a pointing direction that is optically controlled.

SUMMARY OF THE INVENTION

The foregoing and other problems are overcome and the objects of the invention are realized by methods and apparatus in accordance with embodiments of this invention. A novel, optically controlled optical element is constructed to have a diffractive phase mask comprised of optically nonlinear material. The optical element can be considered to be a diffractive phase mask with a lens in the near field, with the focal length of the lens being a function of an intensity of incident light beam via an intensity dependent index of refraction. This arrangement produces a power spectrum of the Fourier transform of the phase mask at a plane located at the focal length of the lens. In this manner the optical element produces an image at a distance that is determined by the incident beam intensity.

In addition, using cross-phase modulation, a first beam having a first wavelength can be used to control a second, co-propagating beam having a second wavelength.

The optical element can also be used as an image gate by simply switching an intensity of a control beam, where the speed of switching is limited by the response time of the nonlinearity. For example, the optical element can be used as an efficient gate for array illumination, where the array is addressed efficiently only when the image is focused.

In accordance with a method of this invention for projecting an image upon a surface, the following steps are executed: (a) providing a diffractive phase shift mask having features for defining the image, the diffractive phase shift mask being optically coupled to a substrate having an intensity-dependent nonlinearity; and (b) propagating an optical beam through the diffractive phase shift mask, through the substrate, and onto the surface. The propagating optical beam has an intensity selected for inducing the nonlinearity in the substrate for at least one of varying a focus of the image on the surface or varying a position of the image on the surface.

BRIEF DESCRIPTION OF THE DRAWINGS

The above set forth and other features of the invention are made more apparent in the ensuing Detailed Description of the Invention when read in conjunction with the attached Drawings, wherein:

FIG. 3A illustrates an image of the phase mask of FIG. 1 with a control laser beam turned on;

DETAILED DESCRIPTION OF THE INVENTION

Figure 1:
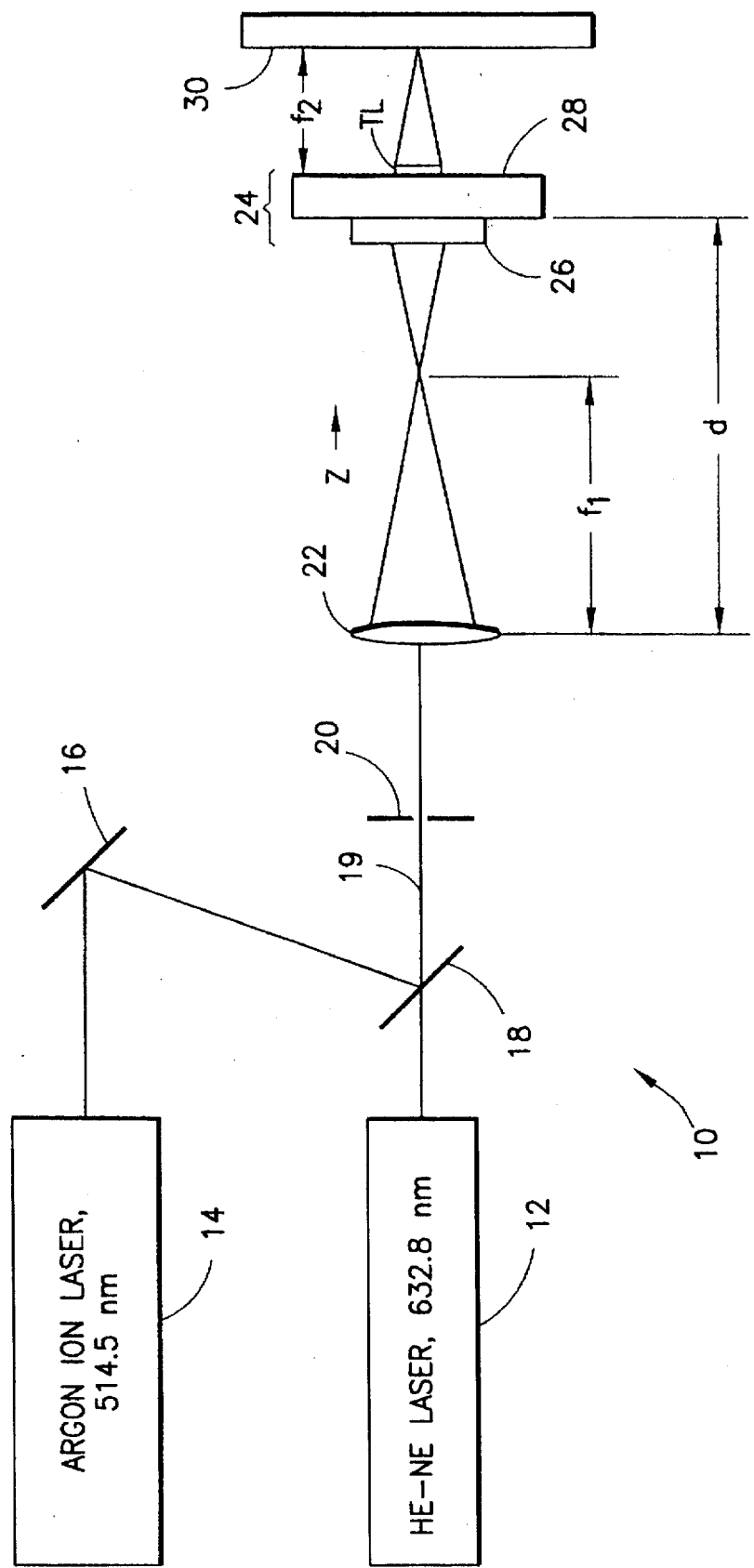
FIG. 1 is a block diagram that illustrates an embodiment of an optical system that includes a nonlinear phase shift mask in accordance with this invention.
Figure 2:
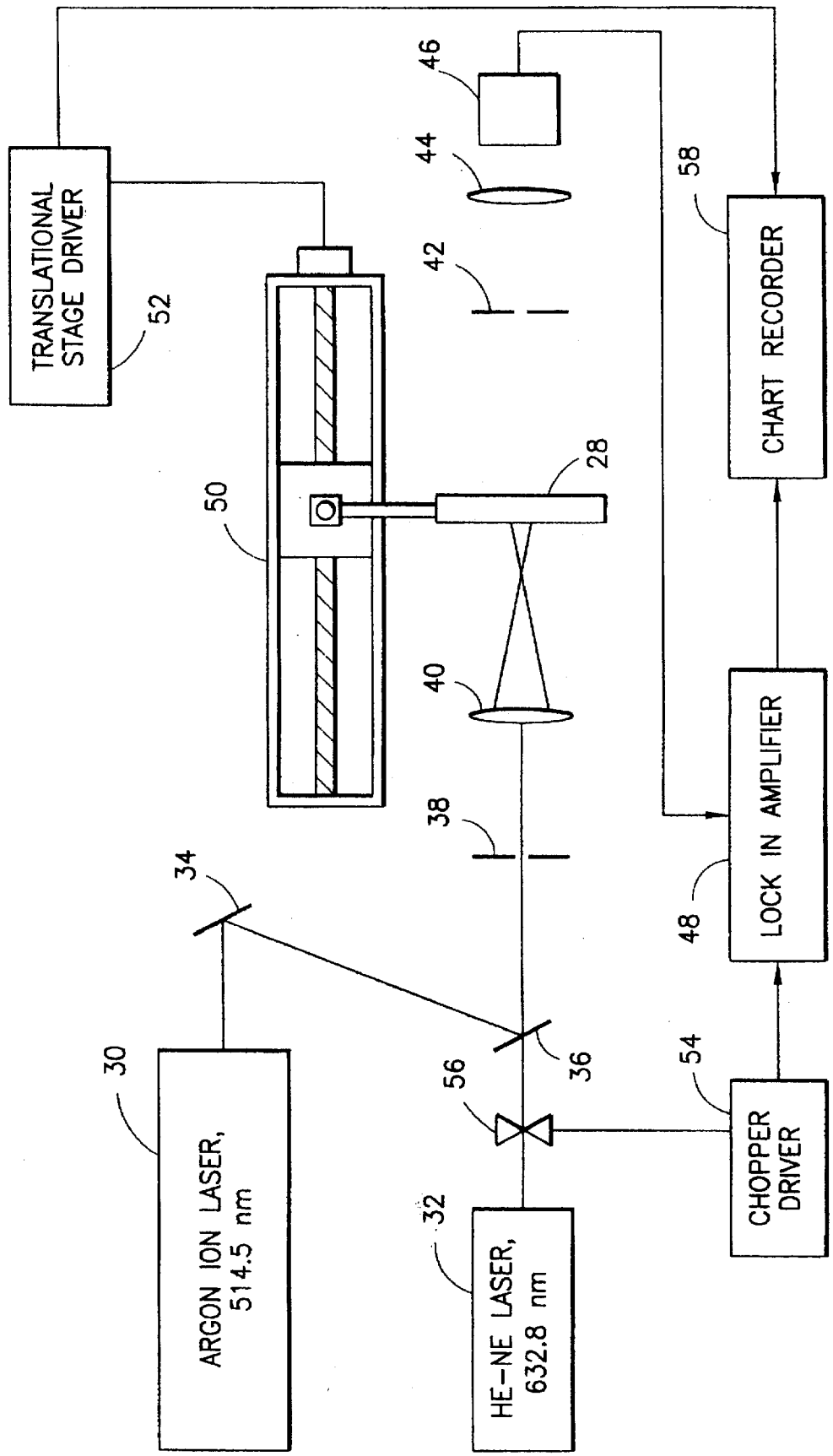
FIG. 2 is a block diagram of a system suitable for measuring $n_2$ for a semiconductor doped glass (SDG) substrate employing a two color or wavelength z-axis scan.

FIG. 1 is a block diagram of an embodiment of an optical system 10 that includes the novel nonlinear phase shift mask (NPSM) 24 of this invention. In the embodiment of FIG. 1 a first laser 12, such as a He-Ne laser operating at 632.8 nm, and a second laser 14, such as an Argon Ion laser operating at 514.5 nm, have their respective output beams combined by a first mirror 16 and by a second, dichroic mirror 18. The combined beam 19 is directed through a pinhole 20 in order to fix the size of the beams and insure parallel propagation. The combined beam 19 is then incident on a lens 22 which focuses the combined beam 19 in order to achieve the necessary intensity for self-imaging. Located at a point beyond the focal length of lens 22 is a spot array generator phase mask (PM) 26 which is combined, in this embodiment, with a semiconductor doped glass (SDG) substrate 28 which functions as a second lens. The SDG substrate 28 has at least one intensity-dependent optical characteristic. The combination of the PM 26 and the SDG substrate 28 forms the NPSM 24 in accordance with an embodiment of this invention. The NPSM 24 can be mounted on a translation stage (shown in FIG. 2) and thus positioned with respect to the focus of the lens 22. The output from the NPSM 24 is projected onto a surface 30, such as, by example, the surface of screen, a semiconductor wafer, a point-addressable array, or a volumetric information storage device. When the distance d, i.e., the distance from the input face of the lens 22 to the input face of the SDG substrate 28, is equal to or greater than a sum of the focal lengths of lens 22 and the thermal lens formed in the SDG substrate 28, a sharply focussed spot array can be formed on the surface 30.

Figure 3A:
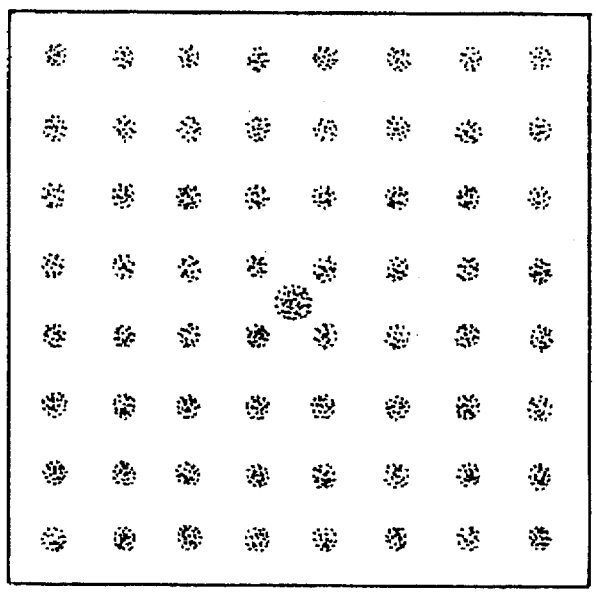

FIG. 3A is an illustration of the image of the NPSM 24 at the wavelength of 632.8 nm, with the SDG filter comprised of a Schott RG610 filter, and with the 514.5 nm beam from laser 14 turned on. As can be seen, each of the imaged spots is sharply focussed on the surface 30. It was determined that as the 514.5 nm beam power was increased to approximately 1 watt, the spot array at 632.8 nm became more and more sharply imaged.

Figure 3B:
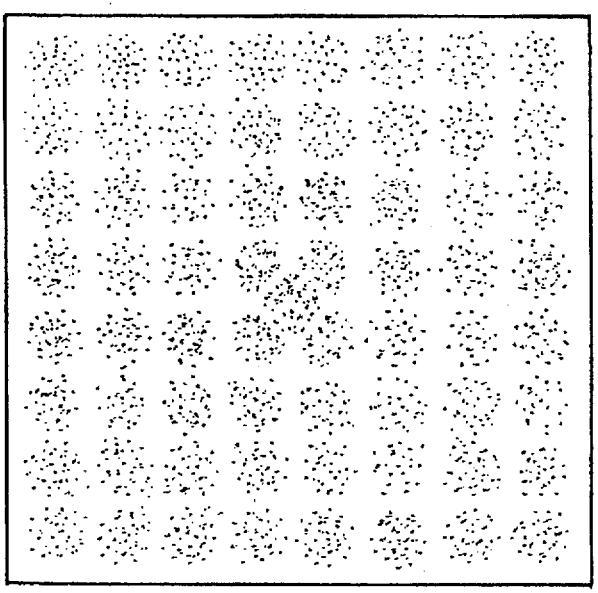
FIG. 3B illustrates an image of the phase mask of FIG. 1 with the control laser beam turned off.

FIG. 3B is an illustration of the image of the NPSM 24 under the same conditions as in FIG. 3A, but with the 514.5 nm beam from laser 14 turned off. As can be seen, each of the imaged spots is now defocussed on the surface 30. This defocussing is a result of the intensity-dependent optical characteristic of the SDG substrate 28.

In the embodiment of FIG. 1 the diffractive phase mask 26 is placed directly against the SDG substrate 28. However, it also within the scope of this invention to construct a monolithic NPSM 24 by etching or otherwise delineating the desired pattern directly into the surface of the SDG substrate 28, or into one or more film layers that are deposited on the surface of the SDG substrate 28.

Using the thermal nonlinearity of the SDG substrate 28, the output of the phase mask 26 is imaged at 632.8 nm by co-propagating the Gaussian laser beam at 514.5 nm through the absorbing SDG substrate 28. That is, in this embodiment the SDG substrate 28 is absorptive of the 514.5 nm light from the second laser 14, is heated thereby, and consequently exhibits the desired thermal nonlinearity. The 632.8 nm light from the first laser, the wavelength to which the spatial features of the phase mask 26 have been optimized, propagates substantially unabsorbed through the SDG substrate 28 and thus forms an image defined by the phase mask 26 on (or within) the surface 30.

Figure 4:
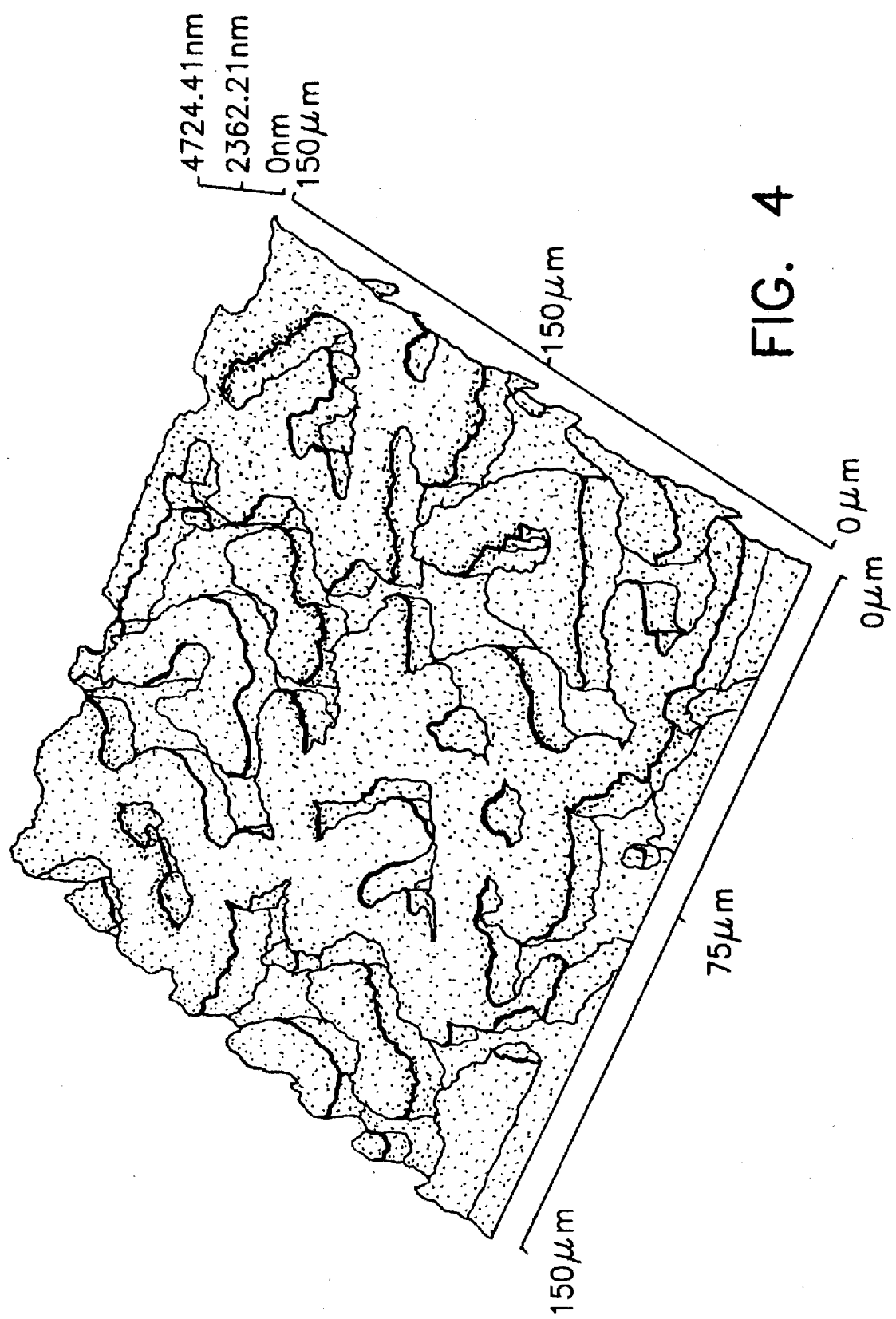
FIG. 4 is an enlarged view of a surface of the phase mask of FIG. 1.

In the embodiment of FIG. 1 the NPSM 24 is comprised of a 0.5 mm thick fused silica diffractive phase mask 26 (e.g., an 8×8 spot array generator) that is attached to the face of the SDG substrate 28 with, by example, a suitable transparent adhesive. FIG. 4 is an enlargement of a portion of the surface of the phase mask 26. Two suitable semiconductor doped (e.g., $CdS_xSe_{1-x}$ containing) glasses that can be employed for the SDG substrate 28 are known as Corning 3-66 and Schott RG610, having exemplary thicknesses of 3 mm and 1 mm, respectively. These particular glasses are commonly used as optical filters.

Since the 3-66 filter has a cut off at 570 nm and the RG610 filter has a cut off near 610 nm, both filters absorb radiation at the 514.5 nm wavelength. The subsequent heating of these SDG substrate materials by absorption of the 514.5 nm beam produces a thermal gradient and an associated thermal lensing effect which roughly traces the intensity profile of the 514.5 nm beam. The resulting thermal lens (TL) is also indicated in FIG. 1. Since the refractive index is linearly dependent on the temperature in the unsaturated absorption limit, the refractive index profile can be expected to be approximately Gaussian, thus mirroring the input beam. The result is the formation of a Gaussian lens in the nearfield of the phase mask 26, which images the array of spots in the far field with the 632.8 nm wavelength beam.

As will be described below, the nonlinear index of refraction at 632.8 nm due to the 514.5 nm excitation was measured using a so-called two color Z-scan technique in order to characterize the NPSM 24.

In general, a plane wavefront passing through a phase mask placed just before a thin focusing lens will image the phase mask at the focus. In practice, however, the situation is more complex since the laser beams are focused before the NPSM 24. To analyze this case one can assume a paraxial approximation and consider a plane phase wave front of 632.8 nm wavelength with a Gaussian field profile incident on the first focusing lens 22 while traveling in the z direction. The field distribution is given by:

$$U = U_0 \exp\left[\frac{X^2 + Y^2}{R^2}\right] \exp[ikz] \qquad (1)$$

where R is the radius of the beam and k is the magnitude of the wave vector. This wavefront first passes through the focusing lens 22 of focal length $f_1$ and then after traversing a distance d, passes through the NPSM 24. While passing through the NPSM 24 the wavefront first encounters the phase mask 26 with the transfer function $\exp[iT(x,y)]$ followed by the thermal lens of the SDG substrate 26 having a variable focal length $f_2$. After exiting the thermal lens, the field distribution is given by:

$$U' = U_0'\exp[iT(x,y)]\exp\left[i\frac{k}{2}(x^2+Y^2)\left\{\frac{d}{l} + \frac{k^2\left(\frac{1}{d}-\frac{1}{f_1}\right)}{4d^2\left[\frac{1}{R^4}+\frac{k^2}{4}\left(\frac{1}{d}-\frac{1}{f_1}\right)^2\right]} - \frac{1}{f}\right\}\right] \qquad (2)$$

where only the relevant phase terms are explicitly included in equation (2). After further traveling an arbitrary distance 1, the field distribution resulting from the Fresnel diffraction formula is given by:

$$U''(X_1,Y_1) = \frac{\exp\left[i\frac{k}{2l}(X_1^2+Y_1^2)\right]}{i\lambda l} \iint U'\exp\left[i\frac{k}{2l}(x^2+y^2)\right] \exp\left[i\frac{k}{2}l(xx_1+yy_1)\right] dxdy \qquad (3)$$

where the integration is performed in the plane perpendicular to direction of propagation just after the NPSM 24. By inspecting equations (2) and 3) it can be seen that the NPSM 24 yields the intensity profile of the Fourier transform of the phase mask 26 at the distance 1 given by, $$l = \left[\frac{1}{f_2} - \frac{1}{d} + \frac{k_2\left(\frac{1}{d}-\frac{1}{f_1}\right)}{4d^2\left[\frac{1}{R^4}+\frac{k^2}{4}\left(\frac{1}{d}-\frac{1}{f_1}\right)^2\right]}\right]^{-1} \qquad (4)$$

In order for this power spectrum or image to be real, 1 has to be positive and $f_2$ must satisfy the condition:

$$f_2 \leq \left[ \frac{1}{d} + \frac{k^2 \left( \frac{1}{d} - \frac{1}{f_1} \right)}{4d^2 \left[ \frac{1}{R^4} + \frac{k^2}{4} \left( \frac{1}{d} - \frac{1}{f_1} \right)^2 \right]} \right]^{-1} \quad (5)$$

This condition reduces to $$f_2 \leq d - f_1 \quad (6)$$

when, $$\frac{1}{R^2} \ll \frac{k}{2} \left( \frac{1}{d} - \frac{1}{f_1} \right). \quad (7)$$

This result can be used to estimate the required focal length for imaging.

In order to estimate the focal length of the actual thermal lens formed in the SDG substrate 28, the Gaussian intensity distribution of incident beam on the NPSM 24 can be approximated by a quadratic profile expressed as $$I = I_0 \left[ 1 - \frac{r^2}{a^2} \right] \quad (8)$$

where, r is the axial distance from the beam center, a is the spot size, and $I_o$ is the peak intensity. This leads to an intensity dependent focal length given by:

$$f_2 = \frac{n_o}{(n_o - 1)n_2 I_o} \cdot \frac{a^2}{l_{\mathit{eff}}}, \quad (9)$$

where $n_o$ is the linear refractive index and $n_2$ is the intensity dependent refractive index of the SDG substrate 28 and $$l_{\mathit{eff}} = \frac{1 - e^{-\alpha l}}{\alpha}, \quad (10)$$

where $l$ is the focal length of the SDG substrate 28 and $\alpha$ is the absorption coefficient. The $n_2$ of the exemplary SDG substrates 28 that were referred to above were measured with the two color Z-scan technique using the system shown in FIG. 2. A beam from an Argon Ion laser 30 and a beam from a He-Ne laser 32, chopped by chopper 56, were combined with mirrors 34 and 36, passed through a pinhole 38, and focussed with a lens 40 onto the SDG substrate 28. The transmitted light from the SDG substrate 28 was passed through a second pinhole 42 and a second lens 44, and was detected by a photodetector 46. The output of the photodetector 46 was provided to an input of a lock-in amplifier 48 and was detected for various positions of the SDG substrate 28 between the lens 40 and the detector 46. The SDG substrate 28 was connected to a linear translation stage 50, driven by a translational stage driver 52, so that its position could be varied. A chopper driver 54 was employed to drive the chopper 56 in synchronism with the operation of the lock-in amplifier 48. A chart recorder 58 was used to monitor the output of the lock-in amplifier 48 for various positions of the translation stage 50. Values for $n_2$ at 632.8 nm induced by the beam at 514.5 nm were calculated using standard formulae, such as those given by N. Finlayson et al. in J. Opt. Soc. Am. B 6, 675–684 (1989).

Using the values measured for $n_2$, the values for the focal lengths for lenses $f_2$ formed in SDG substrates, for a power of 1 W and a nominal spot diameter of 50 microns, can be calculated. The calculated focal lengths, along with measured $n_2$ values, are summarized in Table 1.

TABLE 1

| Filter | $n_2$ in m²/W | absorption coefficient $\alpha$ in cm⁻¹ | Focal length, $f_2$ with 1 W power in 100 μm beam – width |
|---|---|---|---|
| Schott RG610 | $2.140 \times 10^{-11}$ | 30.00 | 3.87 mm |
| Corning 3-66 | $7.678 \times 10^{-12}$ | 13.54 | 5.61 mm |

In conclusion, it has been shown above that a nonlinear phase mask can be constructed and operated to provide an intensity dependent focal point. The nonlinear phase mask provides optically controlled imaging at a desired distance by varying the intensity of the incident beam. In the illustrated embodiment the NPSM 24 was constructed as a hybrid device having the phase mask 26 in contact with the semiconductor doped glass substrate 28. The thermal nonlinearity of the SDG substrate 28 produces an intensity dependent lens which is used to image the NPSM 24 when illuminated with the 632.8 nm line of the He-Ne laser 12. The ability to optically control this self-imaging phase mask can be used in a number of applications.

These applications include image gating, wherein the focus of a desired image is switched one and off. These applications also include the fabrication of integrated circuits, where the NPSM 24 can be employed to image a desired pattern onto a semiconductor wafer during fabrication. Furthermore, due to the ability to vary the focal point of the thermal lens provided by the SDG substrate 28, the same pattern can be imaged at different depths, without requiring a translation of the semiconductor substrate or the NPSM 24, by varying the power of one or more of the laser beams. Another exemplary application involves the illumination of an optically based planar or volumetric information storage media so as to record and/or read out information from selected locations. For example, by varying the power of the Argon Ion laser 14 of FIG. 1, the focal plane of the spot pattern can be varied within the storage media, thereby simultaneously reading out information from spatially separated locations. The read out of information can be accomplished without requiring a relative movement between the optical focussing elements and the storage media.

Although described above with respect to exemplary embodiments, it should be realized that the teaching of this invention is not limited to only these embodiments. For example, the phase mask 26 is not limited to an 8×8 array of spot patterns, nor is it limited to only generating a spot pattern. In general, any desired pattern shape can be employed with this invention, such as a circuit pattern in an integrated circuit. Further by example, the teaching of this invention is not limited for use with only SDG material to provide the intensity-dependent nonlinearity, but can employ any suitable material including polymers, crystals, and other types of glasses. Furthermore, it should be realized that this invention does not require that a thermal lens be created in the substrate 28. The thermal lens is but one example of an intensity-dependent nonlinearity of the substrate material.

Also, and as was indicated above, in some embodiments of this invention it may be desirable to fabricate the NPSM 24 as a monolithic element wherein one surface region is patterned to provide the phase mask elements. In all cases the phase mask can be a binary phase mask or a multi-level phase mask.

It should further be realized that the teaching of this invention is not limited for use with two lasers, but can be practiced with one laser that provides both the illumination of the phase mask 26 and the intensity dependent focussing variation in the SDG substrate 28. In this case it is assumed that sufficient light passes unabsorbed through the SDG substrate 28 so as to provide a useable image. It should also be realized that more than two lasers can be used. For example, and referring again to FIG. 1, it may be desirable to provide the He-Ne laser 12 to illuminate the phase mask 26, a first Argon Ion laser 14 to provide, when switched on, a first degree of thermal lensing of the SDG substrate 28, and also a second Argon Ion laser to provide, when switched on, a second degree of thermal lensing of the SDG substrate 28. The two Argon Ion lasers could operate simultaneously such that their heating effects are additive, and/or they could be operated at different times but with different output power levels (e.g., 1 W and 1.5 W yielding effective power levels of 1 W, 1.5 W and 2.5 W).

Furthermore, although the invention has been described primarily in the context of changing the focus of the image encoded in the phase mask 26, it is also within the scope of the invention to change an angle at which the beam is diffracted from the phase mask 26. In this manner the position of the image on the surface can be spatially shifted.

Thus, while the invention has been particularly shown and described with respect to exemplary embodiments thereof, it will be understood by those skilled in the art that changes in form and details may be made therein without departing from the scope and spirit of the invention.

What is claimed is:

1. An optical element, comprising:
   a diffractive phase shift mask for propagating therethrough an optical beam having an intensity; and
   a substrate optically coupled to said diffractive phase shift mask, said substrate having an intensity dependent nonlinearity that is manifested at least by a change in an index of refraction of said substrate.

2. An optical element as set forth in claim 1, wherein said diffractive phase shift mask is attached to a surface of said substrate.

3. An optical element as set forth in claim 1, wherein said diffractive phase shift mask is formed within or upon a surface of said substrate.

4. An optical element as set forth in claim 1, wherein said diffractive phase shift mask is comprised of silica.

5. An optical element as set forth in claim 1, wherein said substrate is comprised of a semiconductor doped glass.

6. An optical element as set forth in claim 1, wherein said beam is comprised of at least two wavelengths, wherein a first one of the wavelengths is related to feature sizes of said diffractive phase shift mask, and wherein a second one of the wavelengths is selected for being absorbed within said substrate.

7. An optical element as set forth in claim 1, wherein said beam is comprised of at least one wavelength, wherein said at least one wavelength is related to feature sizes of said diffractive phase shift mask, and wherein said at least one wavelength is also absorbed within said substrate.

8. A method for projecting an image upon a surface, comprising the steps of:
   providing a diffractive phase shift mask having features for defining the image, the diffractive phase shift mask being optically coupled to a substrate having an intensity-dependent nonlinearity;
   propagating an optical beam through the diffractive phase shift mask, through the substrate, and onto the surface, the propagating optical beam heating the substrate and inducing a thermal lens in the substrate; and
   changing an intensity of the optical beam so as to change a focal length of the thermal lens relative to the surface.

9. A method as set forth in claim 8, wherein the step of propagating includes the steps of:
   operating a first laser to generate a first beam having a first wavelength that is related to feature sizes of the diffractive phase shift mask;
   operating a second laser to generate a second beam having a second wavelength selected for being absorbed within the substrate;
   combining the first and second beams to form a combined optical beam; and
   propagating the combined optical beam through the diffractive phase shift mask, through the substrate, and onto the surface.

10. A method as set forth in claim 9, wherein the step of changing varies an intensity of the second beam.

11. A method as set forth in claim 8, wherein the step of propagating includes the steps of:
   operating a laser to generate a single beam having a wavelength that is related to feature sizes of the diffractive phase shift mask, the wavelength also being selected for being absorbed within the substrate; and
   propagating the single beam through the diffractive phase shift mask, through the substrate, and onto the surface.

12. A method as set forth in claim 11, wherein the step of changing varies an intensity of the single beam.

13. A method as set forth in claim 8, wherein the step of propagating includes a step of focussing the optical beam.

14. A method as set forth in claim 13, wherein the step of focussing uses a lens having a focal length $F_1$, wherein the thermal lens has a focal length of $f_2$, wherein the lens is disposed at a distance d from the substrate, and wherein $f_2 \leq d - f_1$.

15. A method as set forth in claim 8, wherein the surface is the surface of a screen.

16. A method as set forth in claim 8, wherein the surface is the surface of an information storage device.

17. A method as set forth in claim 8, wherein the surface is the surface of a point-addressable array.

18. A method for projecting an image upon a surface, comprising the steps of:
   providing a diffractive phase shift mask having features for defining the image, the diffractive phase shift mask being optically coupled to a substrate having an intensity-dependent nonlinearity; and
   propagating an optical beam through the diffractive phase shift mask, through the substrate, and onto the surface, the propagating optical beam having an intensity selected for inducing the nonlinearity in the substrate for at least one of varying a focus of the image on the surface or varying a position of the image on the surface.

19. A method as set forth in claim 18, wherein the step of propagating includes the steps of:

operating a first laser to generate a first beam having a first wavelength that is related to feature sizes of the diffractive phase shift mask;

operating at least one second laser to generate a second beam having a second wavelength selected for being absorbed within the substrate;

combining the first and second beams to form a combined optical beam; and propagating the combined optical beam through the diffractive phase shift mask, through the substrate, and onto the surface.

20. A method as set forth in claim 18, wherein the step of propagating includes the steps of:

operating a laser to generate a single beam having a wavelength that is related to feature sizes of the diffractive phase shift mask, the wavelength also being selected for being absorbed within the substrate; and propagating the single beam through the diffractive phase shift mask, through the substrate, and onto the surface.

* * * * *